(12) United States Patent
Nickel et al.

(10) Patent No.: US 8,415,256 B1
(45) Date of Patent: *Apr. 9, 2013

(54) GAP-FILLING WITH UNIFORM PROPERTIES

(76) Inventors: Alexander Nickel, Santa Clara, CA (US); Lu You, San Jose, CA (US); Hirokazu Tokuno, Cupertino, CA (US); Minh Tran, Milpitas, CA (US); Minh Van Ngo, Fremont, CA (US); Hieu Pham, Milpitas, CA (US); Erik Wilson, Santa Clara, CA (US); Robert Huertas, Hollister, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/982,364

(22) Filed: Dec. 30, 2010

Related U.S. Application Data (63) Continuation of application No. 11/408,086, filed on Apr. 21, 2006, now Pat. No. 7,884,030.

(51) Int. Cl.
*H01L 21/31* (2006.01)
*H01L 21/469* (2006.01)

(52) U.S. Cl.
USPC .................................. 438/761; 257/E21.247

(58) Field of Classification Search ........... 257/E21.545, 257/E21.546, E21.588, E21.247, E21.548; 438/761, 763
See application file for complete search history.

(56) References Cited

U.S. PATENT DOCUMENTS

| | | |
|---|---|---|
| 5,139,971 A | 8/1992 | Giridhar et al. |
| 5,656,861 A | 8/1997 | Godinho et al. |
| 5,716,891 A | 2/1998 | Kodama |
| 5,770,469 A | 6/1998 | Uram et al. |
| 5,858,876 A | 1/1999 | Chew |
| 5,908,308 A | 6/1999 | Barsan et al. |
| 5,994,231 A | 11/1999 | Sonego et al. |
| 6,048,475 A | 4/2000 | Kirchhoff et al. |
| 6,096,654 A | 8/2000 | Kirchhoff et al. |
| 6,140,174 A | 10/2000 | Kwon et al. |
| 6,150,238 A * | 11/2000 | Wu et al. ............... 438/435 |
| 6,204,125 B1 | 3/2001 | Lee et al. |
| 6,232,235 B1 | 5/2001 | Cave et al. |
| 6,265,281 B1 * | 7/2001 | Reinberg ............... 438/400 |
| 6,319,848 B1 | 11/2001 | Litwin et al. |
| 6,362,508 B1 | 3/2002 | Rasovsky et al. |
| 6,376,303 B1 | 4/2002 | Seo et al. |
| 6,472,750 B1 | 10/2002 | Sonego et al. |
| 6,489,253 B1 | 12/2002 | Ngo et al. |
| 6,613,657 B1 | 9/2003 | Ngo et al. |
| 6,809,402 B1 | 10/2004 | Hopper et al. |
| 6,955,997 B1 | 10/2005 | Halliyal et al. |
| 7,118,987 B2 | 10/2006 | Fu et al. |
| 7,884,030 B1 * | 2/2011 | Nickel et al. ............ 438/761 |

(Continued)

*Primary Examiner* — Matthew Landau
*Assistant Examiner* — Latanya N Crawford
(74) *Attorney, Agent, or Firm* — Volpe and Koenig P.C.

(57) ABSTRACT

During semiconductor fabrication homogeneous gap-filling is achieved by depositing a thin dielectric layer into the gap, post deposition curing, and then repeating deposition and post deposition curing until gap-filling is completed. Embodiments include depositing a layer of low deposition temperature gap-fill dielectric into a high aspect ratio opening, such as a shallow trench or a gap between closely spaced apart gate electrode structures, as at a thickness of about 10 Å to about 500 Å, curing after deposition, as by UV radiation or by heating at a temperature of about 400° C. to about 1000° C., depositing another layer of low deposition temperature gap-filled dielectric, and curing after deposition. Embodiments include separately depositing and separately curing multiple layers.

14 Claims, 13 Drawing Sheets

U.S. PATENT DOCUMENTS

| | | |
|---|---|---|
| 8,026,151 B2 * | 9/2011 | Ang ............................. 438/424 |
| 2001/0050397 A1 | 12/2001 | Matsumoto et al. |
| 2002/0042186 A1 | 4/2002 | Kirchhoff |
| 2002/0052119 A1 | 5/2002 | Van Cleemput |
| 2002/0115302 A1 | 8/2002 | Mukai et al. |
| 2002/0173169 A1 | 11/2002 | Campana et al. |
| 2003/0036230 A1 | 2/2003 | Mehta |
| 2003/0086679 A1 | 5/2003 | Gao et al. |
| 2005/0200026 A1 | 9/2005 | Liaw |
| 2005/0266676 A1 | 12/2005 | Hill |
| 2006/0030165 A1 | 2/2006 | Ingle et al. |
| 2006/0205112 A1 | 9/2006 | Standing et al. |
| 2007/0072387 A1 * | 3/2007 | Lai et al. ....................... 438/424 |
| 2008/0138983 A1 | 6/2008 | Lien et al. |
| 2008/0280441 A1 | 11/2008 | Lee et al. |

* cited by examiner

GAP-FILLING WITH UNIFORM PROPERTIES

CROSS REFERENCE TO RELATED APPLICATION

This application is a Continuation of U.S. patent application Ser. No. 11/408,086, filed Apr. 21, 2006, which is incorporated by reference as if fully set forth.

FIELD OF INVENTION

The present invention relates to a method of manufacturing semiconductor devices exhibiting high reliability and uniform gap-filling. The present invention enjoys particular applicability in fabricating high density, multi-level, flash memory devices with improved gap-filling.

BACKGROUND OF THE INVENTION

Semiconductor memory devices, such as erasable, programmable, read-only memories (EPROMs), electrically erasable programmable read-only memories (EEPROMs), and flash erasable programmable read-only memories (FEPROMs) are erasable and reusable, and are employed in various commercial electronic devices, such as computers, cellular telephones and digital cameras. There has recently evolved devices termed mirrorbit devices which do not contain a floating gate electrode. In mirrorbit devices, the gate electrode is spaced apart from the substrate by an oxide/nitride/oxide (ONO) stack, such as a silicon oxide/silicon nitride/silicon oxide stack. In such devices, the charge is contained within the nitride layer of the ONO stack. The relentless drive for miniaturization has led to the fabrication of various types of flash memory devices comprising transistors having a gate width of about 150 nm and under, and gate structures spaced apart by a gap of 225 nm or less. Conventional practices comprise forming a sidewall spacer on side surfaces of the gate stack, thereby reducing the gate gap to about 25 nm.

As device dimensions shrink into the deep sub-micron regime, vulnerability to mobile ion contamination, such as hydrogen ion degradation, increases, and it becomes increasingly more difficult to satisfactorily fill high aspect ratio gaps between neighboring transistors, as well as to satisfactorily fill high aspect ratio openings, such as shallow trenches for trench isolation structures and gaps between metal lines, such as bit lines and aluminum lines. The inability to adequately getter mobile ion contaminants, such as hydrogen ions, results in a neutralization of electrons and, hence, leakage causing programming loss as well as a charge gain causing reappearance of erased information. The inability to adequately fill gaps between neighboring transistors leads to void formation and an open contact with consequential shorting between contacts causing leakage and low production yields.

A pre-metal dielectric layer or first interlayer dielectric ($ILD_0$) is typically deposited over gate electrode structures filling the gaps, followed by rapid thermal annealing. Conventional practices comprise depositing a boron-phosphorous-silicon oxide derived from tetraethyl orthosilicate (BP-TEOS) or a phosphorous doped high density plasma (P-HDP) oxide as the $ILD_0$. However, such oxides fall short of addressing both the mobile ion contamination and void formation problems.

The inability to satisfactorily fill other various openings and gaps during semiconductor fabrication leads to various problems, including void formation and short circuiting. There have recently become available various low deposition temperature dielectric materials designed to fill high aspect ratio openings and gaps, such as openings and gaps having an aspect ratio of 3:1 or greater. Such materials include, for example, Aziva Flowfill materials manufactured by Aziva Technology, Inc. located in Newport, England; and HARP (Applied Materials High Aspect Ratio Fill Process) available from Applied Materials located in Santa Clara, Calif. Other conventional spin-on materials designed to fill high aspect ratio openings include BPTEOS, boron-doped silicon oxide derived from tetraethyl orthosilicate (BTEOS); and phosphorous-doped silicon oxide derived from tetraethyl orthosilicate (PTEOS). Such materials are conventionally deposited and then subject to post deposition annealing in order to increase the density of the deposited material, improve wet etch characteristics and improve moisture resistance. However, the effective deposition of such materials in high aspect ratio openings remains problematic, because the deposited material within the opening, typically at the bottom of the opening, does not exhibit the same properties as the deposited material at the top of the opening or at a distance from the opening. As a result of such a difference in properties or inhomogeneities, the dielectric material proximate the bottom of the filled opening exhibits a wet etch rate significantly greater than the wet etch rate of the dielectric material in other areas, such as at the upper portion of the filled opening or at a distance from the opening. Further, it was found that after curing voids existed in the bottom of the opening. Such nonuniformities and voids lead to various problems, including short circuiting and leakage, as well as low production yields.

Accordingly, there exists a need for methodology enabling the fabrication of semiconductor devices with improved reliability, increased operating speed, reduced device leakage and homogenously deposited dielectric layers filling gaps and openings. There exists a particular need for methodology enabling the fabrication of flash memory devices, such as mirrorbit devices, with improved data retention, increased opening speed, reduced device leakage, homogeneously filled gaps and openings, and improved reliability.

DISCLOSURE OF THE INVENTION

An advantage of the present invention is a method of fabricating a semiconductor with uniform gap-filling and improved reliability.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: depositing a first layer of dielectric material into an opening of a layer or into a gap between elements; curing the deposited first layer of dielectric material; depositing a second layer of dielectric material on the deposited first layer of dielectric material and into the gap; and curing the deposited second layer of dielectric material.

Embodiments of the present invention include depositing at least one additional layer of dielectric material into the opening or gap, e.g., a total of three to six layers, and separately curing each additional layer of dielectric material after it is deposited. Embodiments include depositing each dielectric material at a thickness of about 10 Å to about 500 Å, e.g., at a thickness of about 250 Å to about 500 Å, and then curing each layer after it is deposited, as by heating at a temperature of about 400° C. to about 1000° C., or by UV radiation. Embodiments further include depositing plural layers with intermediate deposition curing in forming a shallow trench isolation structure, filling gaps between closely spaced apart gate electrode structures, including mirrorbit devices, as well as filling gaps between conductive lines, such as aluminum lines and poly bit lines.

Additional advantages of the present invention will become readily apparent to those skilled in this art from the following detailed description wherein embodiments of the present invention are described simply by way of illustration of the best mode contemplated to carry out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 3 through 6, similar features are denoted by similar reference characters.

In FIGS. 7 through 12, similar features are denoted by similar reference characters.

DESCRIPTION OF THE INVENTION

The present invention addresses and solves various reliability problems attendant upon conventional semiconductor fabrication techniques. These problems arise as device dimensions continue to shrink, creating closely spaced apart elements, such as gate electrode stacks or conductive lines, with high aspect ratio gaps or high aspect ratio openings in layers, e.g., STI.

Conventional semiconductor fabrication techniques comprise depositing various dielectric materials at a relatively low deposition temperature, e.g., at a temperature of about 0° C. to about 600° C., to fill high aspect ratio openings or gaps, such as Aziva Flowfill, HARP, as well as BPTEOS, BTEOS and PTEOS. However, upon annealing the deposited gap-fill materials, voiding and nonuniformities occur, notably an increase in the wet etch rate at the bottom of a filled opening or gap.

Figure 1:
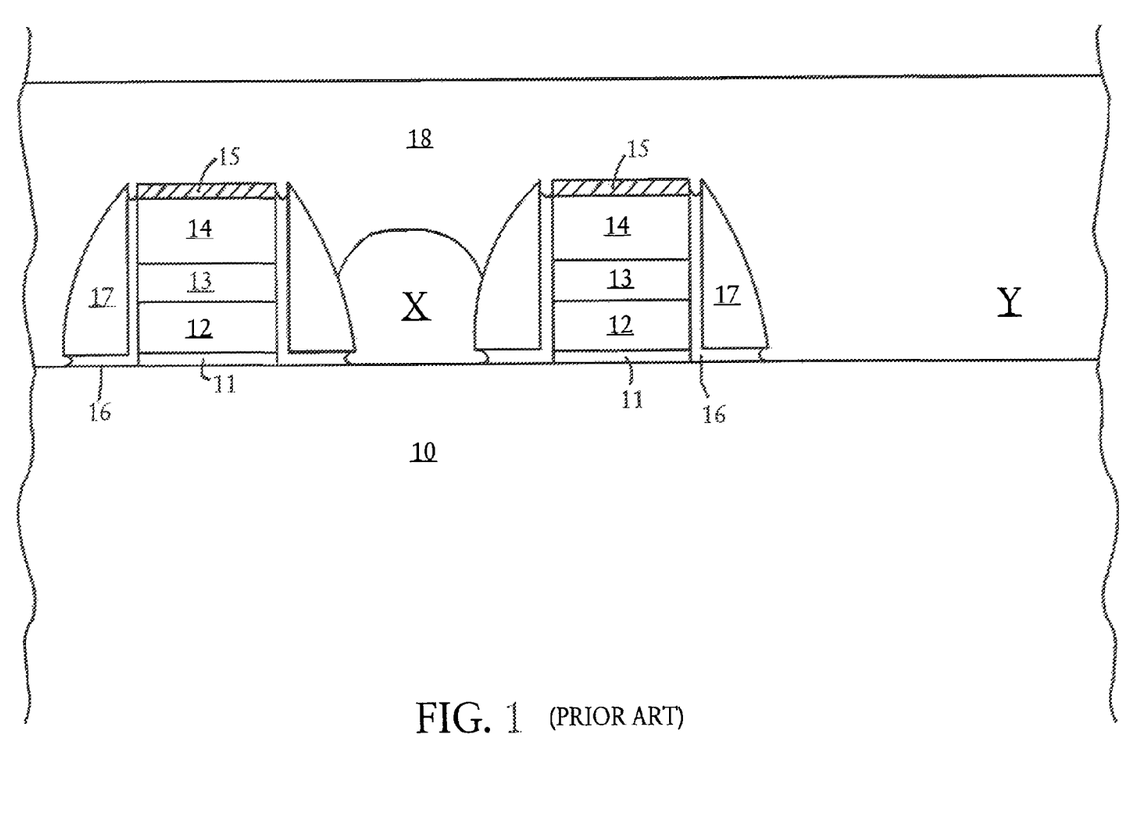
FIG. 1 schematically illustrates a gap-filling problem attendant upon conventional practices.

For example, adverting to FIG. 1, there are illustrated two gate electrode structures on substrate 10. Each gate electrode structure comprises a gate dielectric layer 11, a floating gate 12, and interpoly dielectric, such as a silicon oxide/silicon nitride/silicon oxide (ONO) stack, and a control gate electrode 14. Reference character 15 denotes a metal silicide, such as cobalt silicide. Each gate electrode stack typically comprises sidewall spacers, such as a silicon oxide liner 16 and layer of silicon nitride 17. The gap between the gate electrode structures is filled by depositing a pre-metal dielectric or first interlayer dielectric ($ILD_0$) 18, followed by post deposition curing, as at a temperature of about 400° C. to 1000° C. Such post deposition annealing is implemented in order to increase the density of the deposited dielectric layer, improve the wet etch rate and to improve the ability of the deposited layer to resist moisture absorption. However, it was found that in the area proximate the bottom of the gap, designated by reference character "X", voiding occurs. Further, it was found that in the area designated by "X", the wet etch rate is significantly greater than the wet etch rate at the top of the opening or at a location remote for the opening, as at the location "Y".

Figure 2:
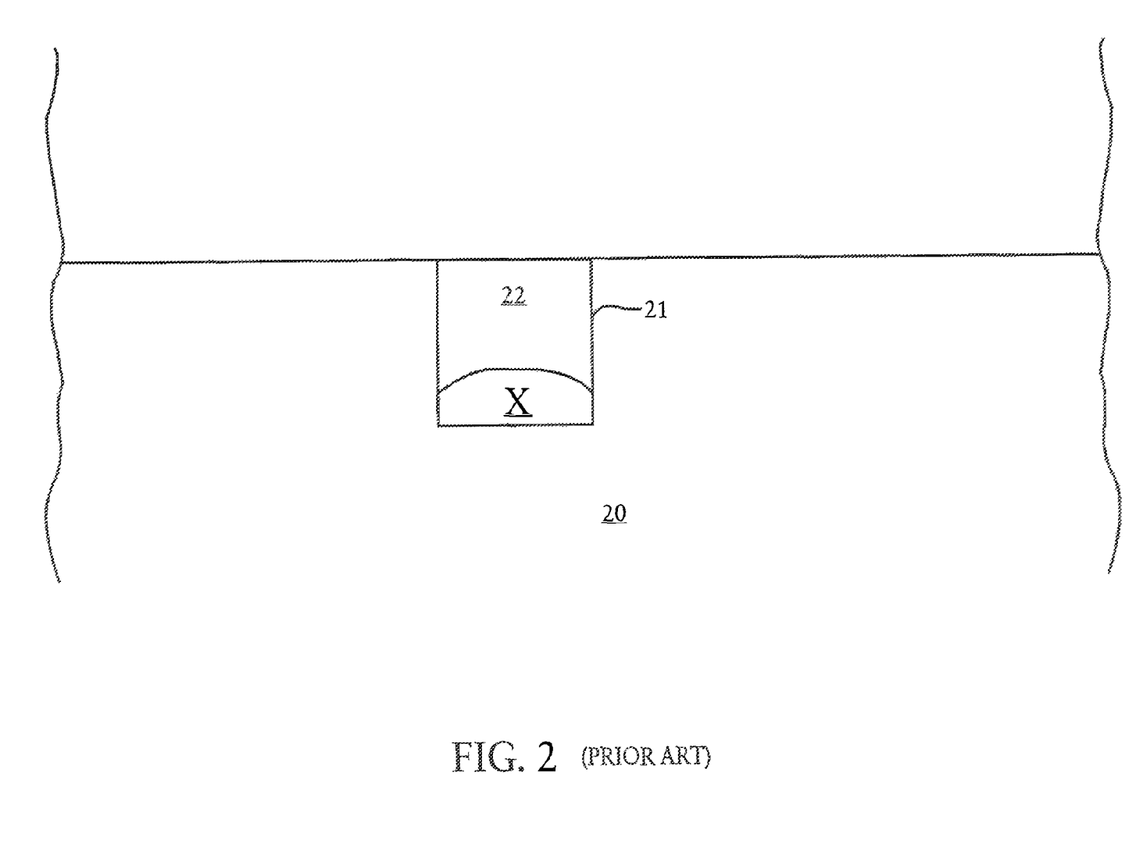
FIG. 2 schematically illustrates a problem attendant upon conventional STI implementation.

A similar problem exists when implementing STI techniques, as shown in FIG. 2. A shallow trench 21 is formed in substrate 20 and filled with a dielectric material 22. After post-deposition annealing, the bottom of the opening, designated by reference character "X", typically exhibits voiding and/or an increased wet etch rate vis-à-vis the material at the upper portion of the filled opening. Such voiding and nonuniformities occur throughout semiconductor fabrication when filling a gap or an opening, such as a gap between poly bit lines or aluminum lines.

The present invention addresses and solves such nonuniform gap-filling problems by strategically depositing the gap-fill material in a plurality of layers and conducting a separate post deposition cure after each layer is deposited. It was found by depositing plural dielectric layers with intervening post deposition curing, each thin layer is completely cured and, hence, exhibits uniform properties, such as a uniformly low wet etch rate, and voiding is prevented.

Embodiments of the present invention comprise depositing a plurality of thin dielectric layers, as at a thickness of about 10 Å to about 500 Å, e.g., about 250 Å to about 500 Å, with separate post deposition curing of each deposited layer to fill openings and gaps having a high aspect ratio, e.g., an aspect ratio 3:1 or greater. Embodiments of the present invention comprise depositing, for example, two to six separate dielectric layers, with post deposition curing after each dielectric layer is deposited, e.g., three to five dielectric layers.

Curing can be conducted in any conventional manner, as by heating at a temperature of about 400° C. to about 1000° C. Such annealing can be implemented in a furnace or oven, in an atmosphere of nitrogen, steam ($H_2O$), or a forming gas containing nitrogen and hydrogen, or by rapid thermal annealing. Post deposition curing can also be implemented by exposure to UV radiation.

In accordance with embodiments of the present invention, each entire thin layer is fully cured so that the deposited dielectric material exhibits a uniformly low wet etch rate throughout the entire film thickness. Embodiments of the present invention enable the fabrication of semiconductor devices having uniform properties while avoiding the generation of voids during gap-filling.

The expression "gap-fill" or "gap-filling" is intended to encompass various aspects of semiconductor fabrication in which a dielectric material is deposited into an opening or a gap. In accordance with embodiments of the present, any of various conventional dielectric gap-fill materials can be employed. When filling gaps between closely spaced apart gate electrode structures, such as in flash memory mirrorbit devices with gate electrodes comprising a gate dielectric stack (ONO) with a gate electrode thereon, it is desirable to deposit a first dielectric layer with a relatively high boron content for improved fluidity, particularly in situations where undercut portions exist in the sidewall spacers, and to deposit a subsequent dielectric layer exhibiting a high phosphorous content for improved gettering of mobile ion contaminants, such as hydrogen ions. Accordingly, in embodiments of the present invention involving memory devices, such as mirrorbit devices, the first and second dielectric layers can comprise BPTEOS, wherein the first dielectric layer contains a higher concentration of boron than the second dielectric layer but a lower phosphorous content than the second dielectric layer. Embodiments of the present invention involving memory devices also include depositing a first dielectric layer of BTEOS, post deposition curing, and depositing a second dielectric layer of PTEOS, followed by post deposition curing.

Mirrorbit technology is fundamentally different and more advanced than conventional floating gate technology, thereby enabling innovative and cost-effective advancements. A mirrorbit cell doubles the intrinsic density of a flash memory array by storing two physically distinct bits on opposite sides of a memory cell, typically within the nitride layer of the ONO stack of the gate dielectric layer separating the gate from the substrate. Each bit within a cell serves as a binary unit of data, e.g., either 1 or 0, mapped directly to the memory array. Reading or programming one side of a memory cell occurs independently of whatever data is stored on the opposite side of the cell. Consequently, mirrorbit technology delivers exceptional read and write performance for wireless and embedded markets.

Figure 3:
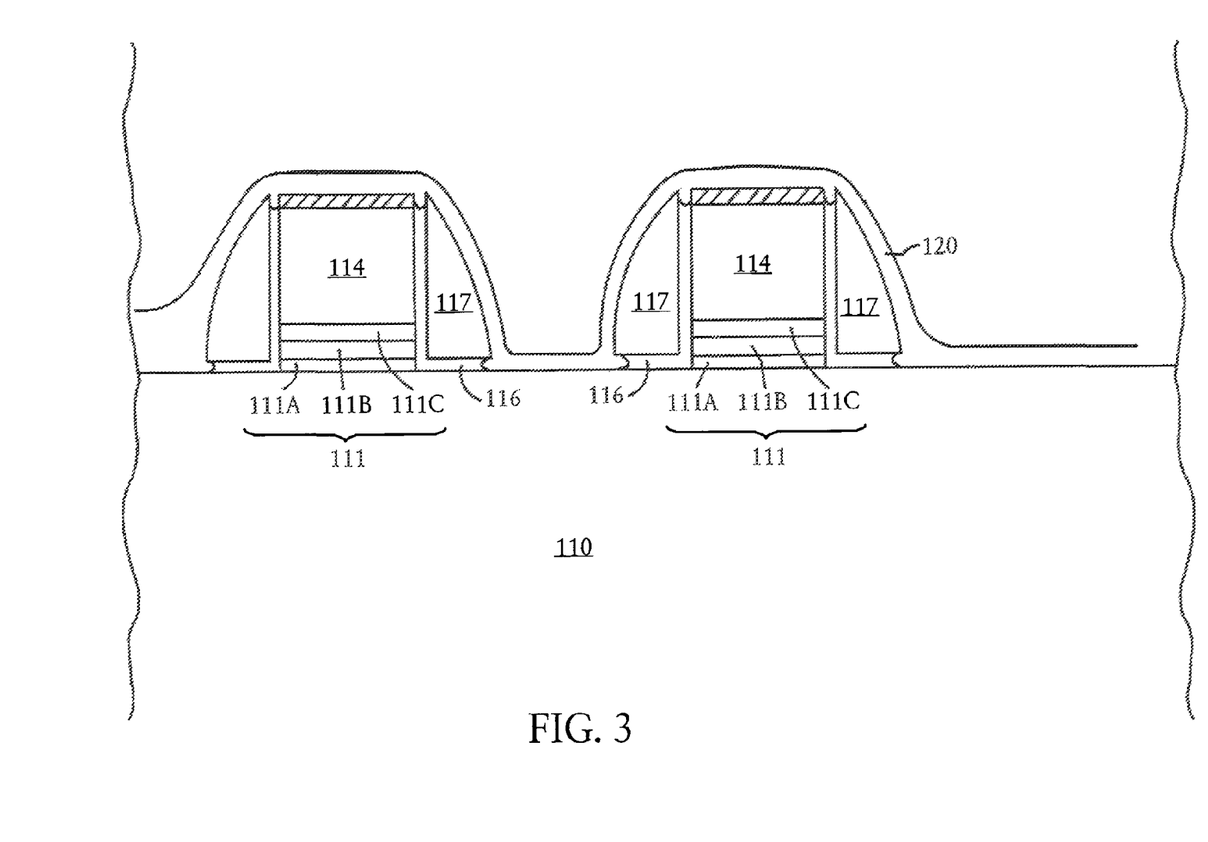
FIGS. 3 and 4 schematically illustrate a gap-filling embodiment of the present invention.
Figure 4:
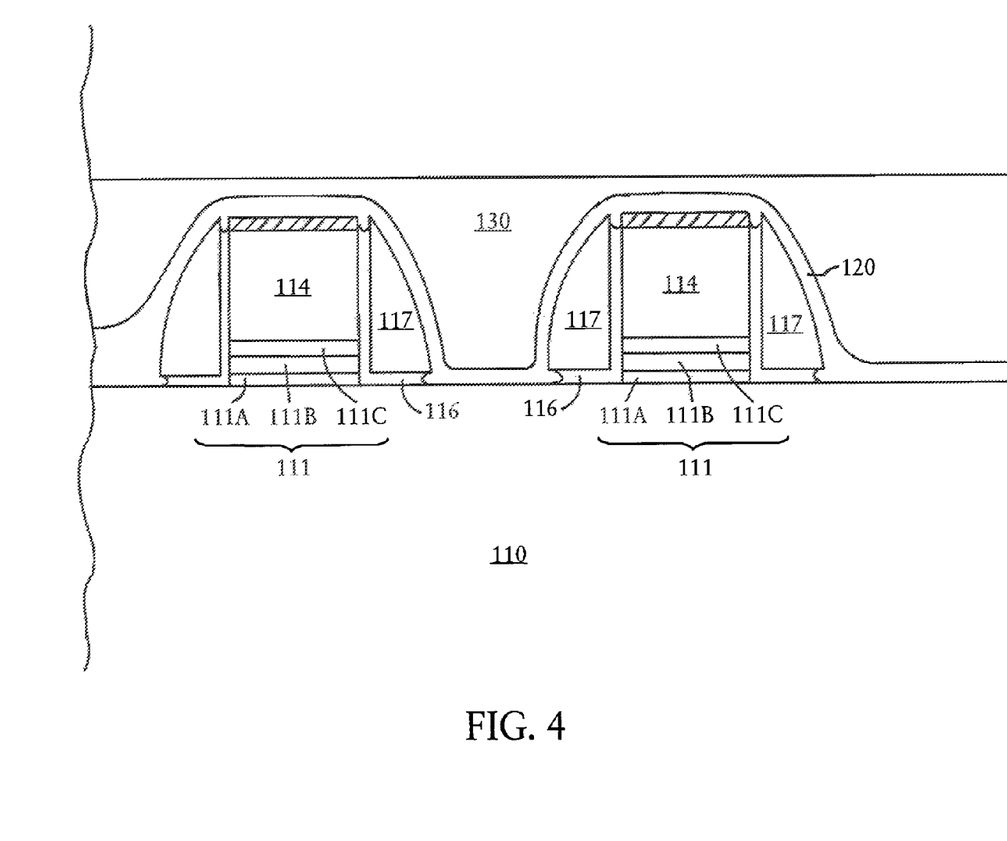

An embodiment of the present invention applied to a flash memory mirrorbit device is schematically illustrated in FIGS. 3 and 4, wherein similar features are denoted by similar reference characters. Adverting to FIG. 3, spaced apart gate electrode stacks of a mirrorbit device are formed on substrate 110. For illustrative convenience, the associated source/drain regions are not illustrated. Each gate electrode stack comprises a gate dielectric layer 111 formed of a composite ONO stack comprising silicon oxide layer 111A, silicon nitride layer 111B, and silicon oxide layer 111C, and a gate electrode 114 formed thereon. Typically, sidewall spacers are formed on side surfaces of the gate electrode stack, which sidewall spacers can include a silicon oxide liner 116 and silicon nitride spacers 117. A metal silicide layer 115, such as cobalt silicide or nickel silicide, can be formed on the gate electrode 114.

With continued reference to FIG. 3, in accordance with embodiments of the present invention, a first layer of dielectric material 120 is deposited, as at a thickness of about 10 Å to about 500 Å, e.g., about 250 Å to about 500 Å. First dielectric material 120 can be any of various dielectric materials designed for filling high aspect ratio openings. In accordance with embodiments of the present invention, first dielectric layer 120 can be BTEOS or BPTEOS with a relatively high boron concentration for improved gap-filling. After depositing the first dielectric layer 120, post deposition curing is conducted, as by annealing at a temperature of about 400° C. to about 1000° C. Because first dielectric layer 120 is very thin, uniform properties are achieved upon post deposition annealing, such that dielectric layer 120 exhibits a uniformly low wet etch rate and uniform density across its entire thickness. Further, by depositing plural dielectric layers with intermediate post deposition curing of each deposited layer, voiding at the bottom of the gap between the gate electrode structures is avoided.

Adverting to FIG. 4, a second dielectric layer 130 is deposited, such as PTEOS or BPTEOS. Upon employing BPTEOS for layer 120 and layer 130, layer 120 which contain a higher boron content than layer 130 and a lower phosphorous content than layer 130. Layer 130 would desirably contain a higher phosphorous content for improved gettering of mobile ion contaminants, such as hydrogen ions. Subsequent to depositing layer 130, post deposition curing is conducted. Post deposition curing of dielectric layer 130 can be implemented in a manner similar to post deposition curing of layer 120. Subsequently, chemical mechanical polishing (CMP) is conducted resulting in the structure illustrated in FIG. 4.

Figure 5:
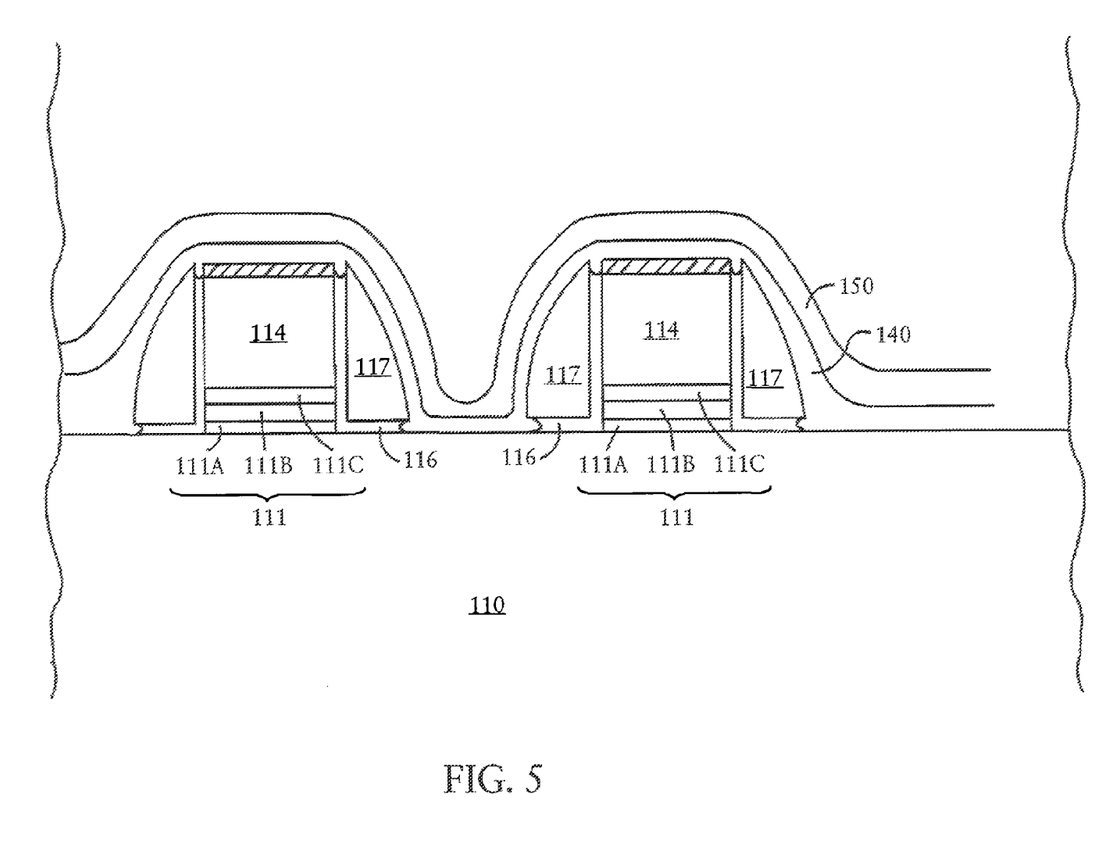
FIGS. 5 and 6 schematically illustrate another gap-filling embodiment of the present invention.
Figure 6:
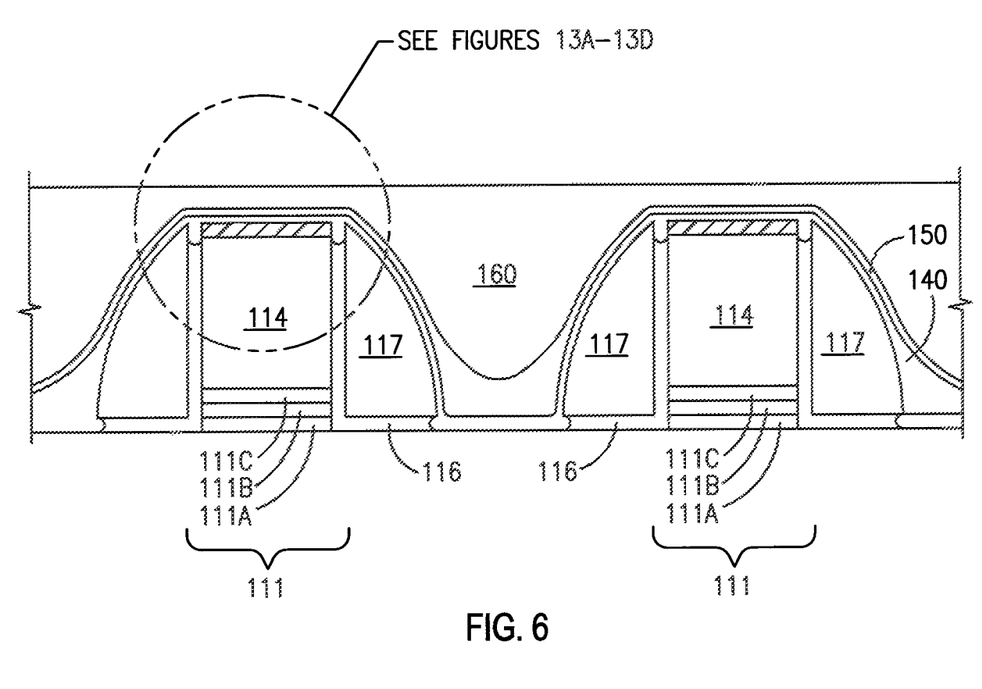

Another embodiment of the present invention applied to a mirrorbit device is schematically illustrated in FIGS. 5 and 6. Features in FIGS. 5 and 6 similar to those appearing in FIGS. 3 and 4 bear similar reference characters and are not described again. In accordance with this embodiment of the present invention, a first layer of dielectric material 140 is deposited followed by post deposition curing. Subsequently, a second layer of dielectric material 150 is deposited followed by post deposition curing. Subsequently, as illustrated in FIG. 6, a third layer of dielectric material 160 is deposited, followed by post deposition curing. Subsequently, CMP is implemented resulting in the structure illustrated in FIG. 6. It should be understood that although three different layers of dielectric material are deposited in the embodiment illustrated in FIGS. 5 and 6, a greater number of individual dielectric layers can be deposited with post deposition annealing conducted after depositing each dielectric layer, such as from three to six layers, or even more.

Figure 13A:
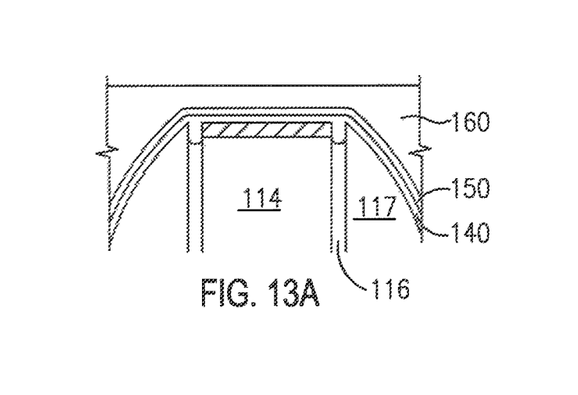
FIGS. 13a-13d illustrate additional gap-filling embodiments.
Figure 13B:
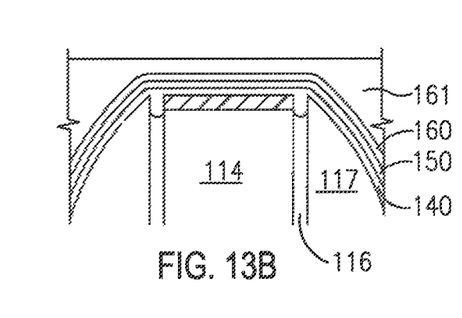
Figure 13C:
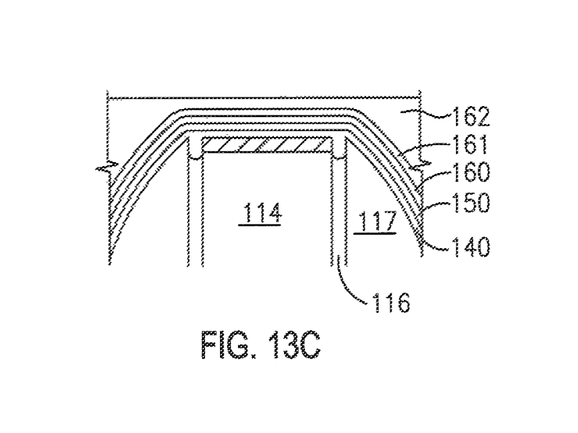
Figure 13D:
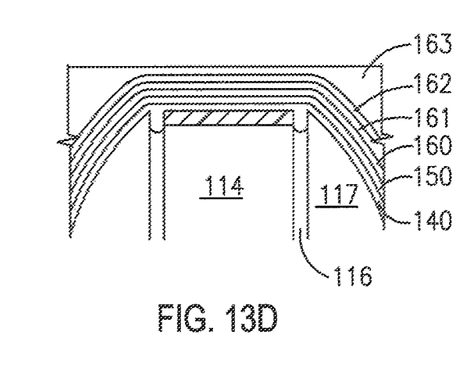

FIGS. 13a-13d illustrate additional gap-filling embodiments. For example, FIG. 13a illustrates an embodiment including 3 layers of dielectric material, (i.e., layers 140, 150 and 160). FIG. 13b illustrates an embodiment including 4 layers of dielectric material, (i.e., layers 140, 150, 160 and 161). FIG. 13c illustrates an embodiment including 5 layers of dielectric material, (i.e., layers 140, 150, 160, 161 and 162). FIG. 13d illustrates an embodiment including 6 layers of dielectric material, (i.e., layers 140, 150, 160, 161, 162 and 163).

Figure 7:
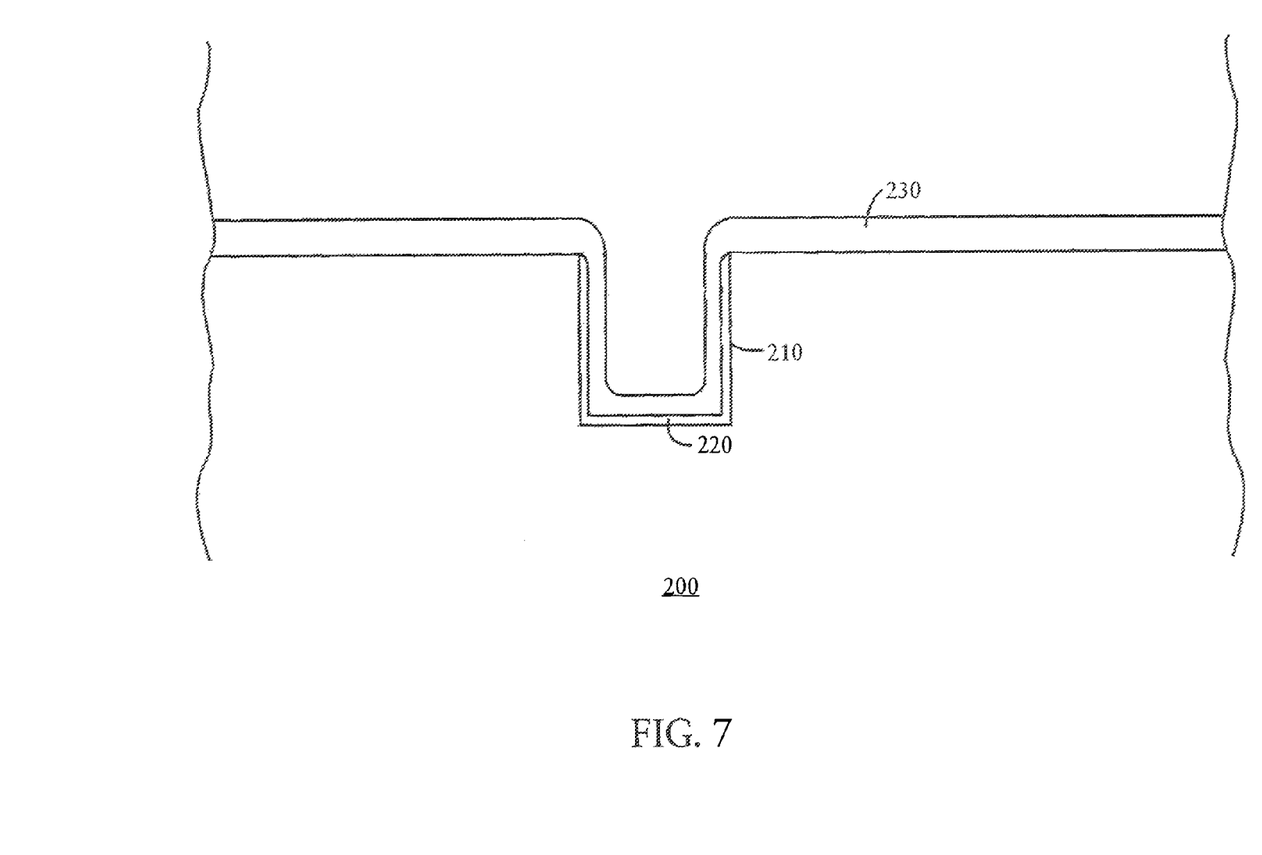
FIGS. 7 through 9 schematically illustrate an STI embodiment of the present invention.
Figure 8:
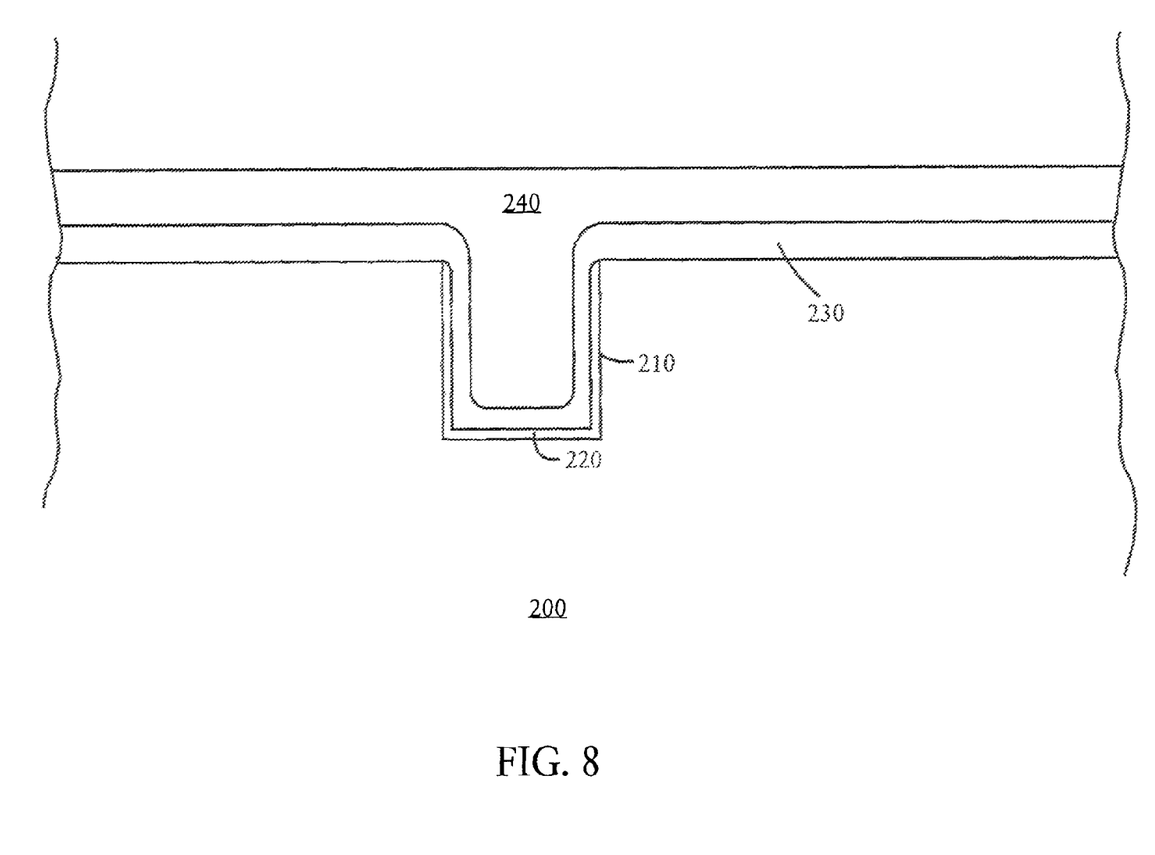
Figure 9:
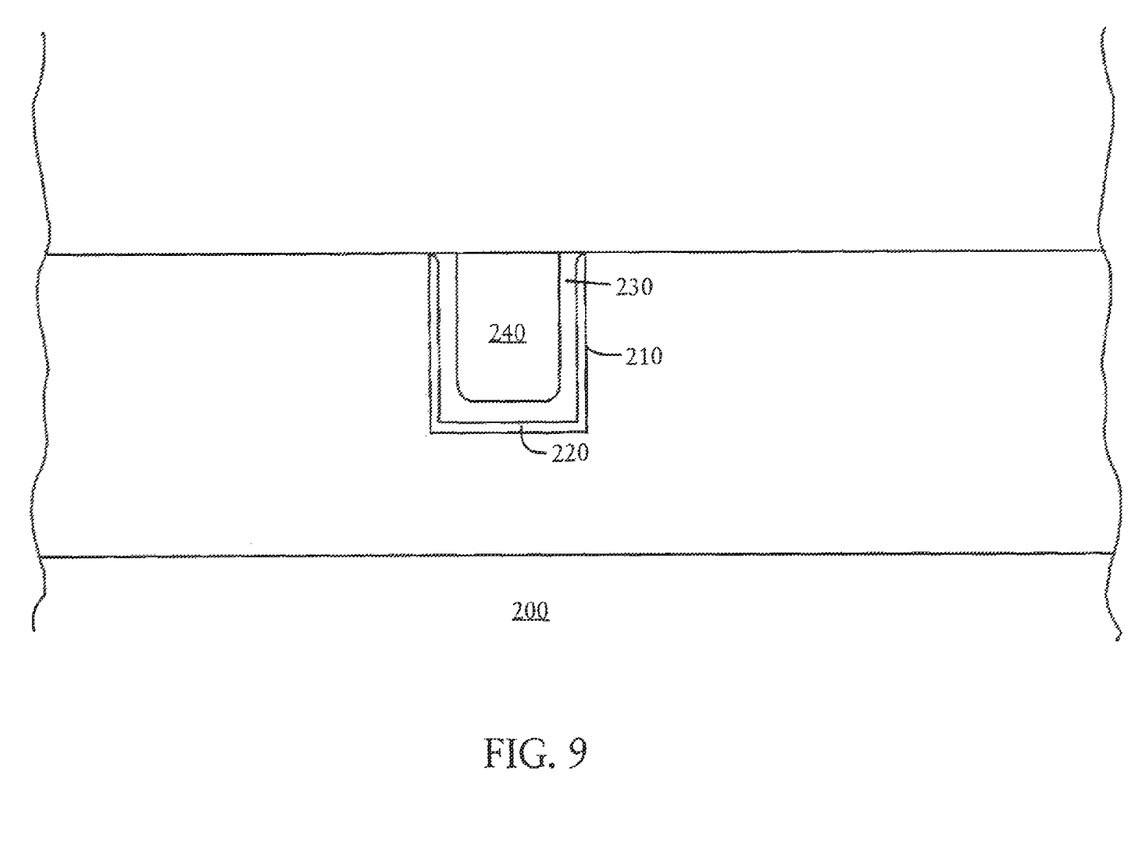

Another embodiment of the present invention related to STI is schematically illustrated in FIGS. 7 through 9, wherein similar features bear similar reference characters. Adverting to FIG. 7, a shallow trench 210 is formed in semiconductor substrate 200. Subsequently, a thermal oxide liner 220 is formed in the trench in a conventional manner. In accordance with an embodiment of the present invention, a first layer of dielectric material 230 is deposited followed by post deposition curing. As in the previously illustrated embodiments, each layer of dielectric material can be deposited at a thickness of about 10 Å to about 500 Å, e.g., about 250 Å about 500 Å. Post deposition curing of deposited layer 230 can be implemented, as by heating at a temperature of about 400° C. to about 1000° C.

Subsequently, as illustrated in FIG. 8, a second dielectric layer 240 is deposited followed by post deposition curing. Deposited layer 240 can be cured in the same manner as layer 230. Subsequently, CMP is implemented resulting in this structure illustrated in FIG. 9.

Figure 10:
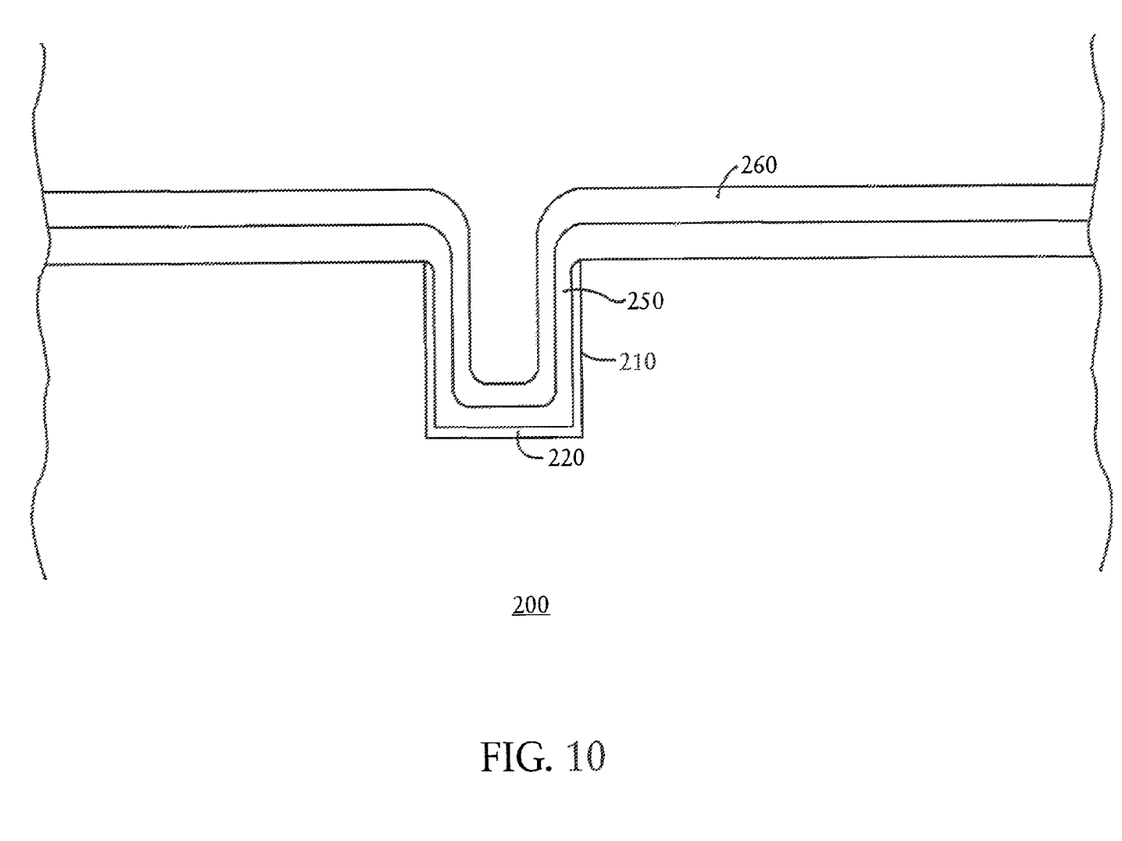
FIGS. 10 through 12 schematically illustrate another STI embodiment of the present invention.
Figure 11:
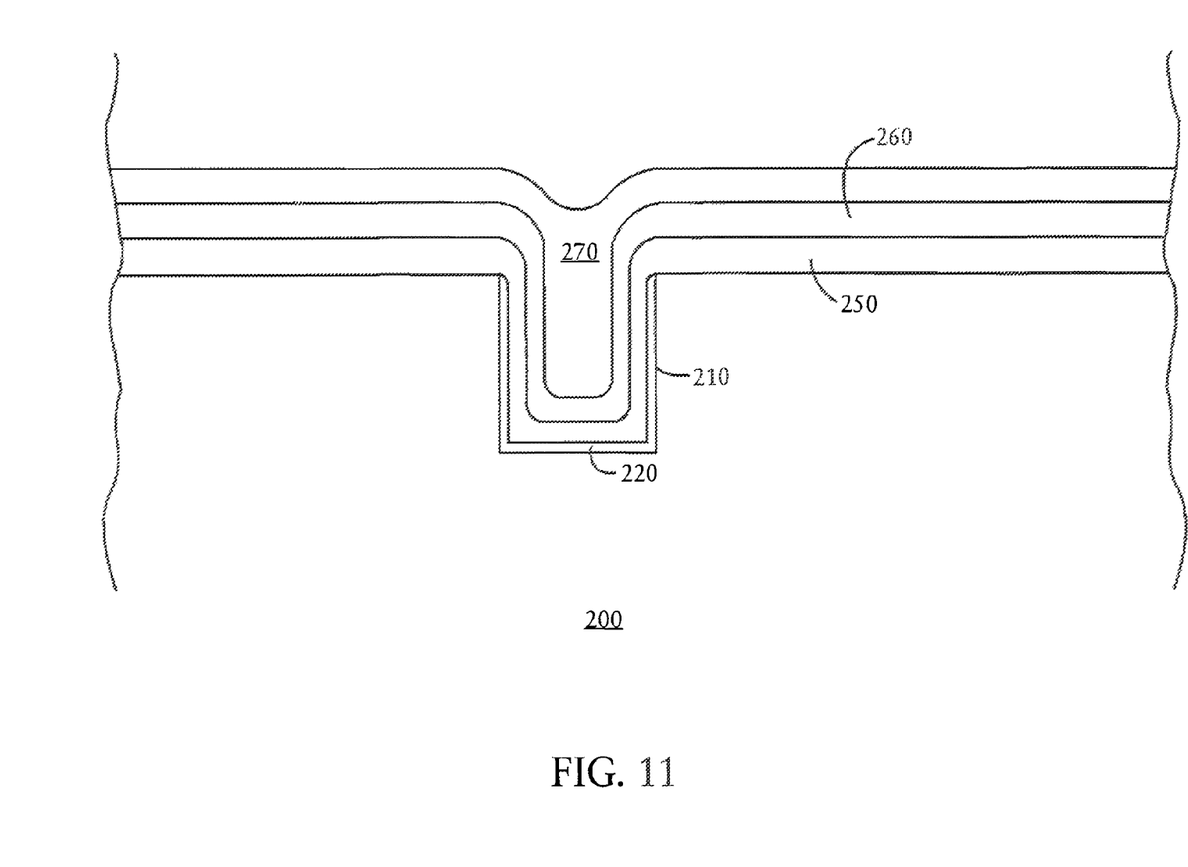
Figure 12:
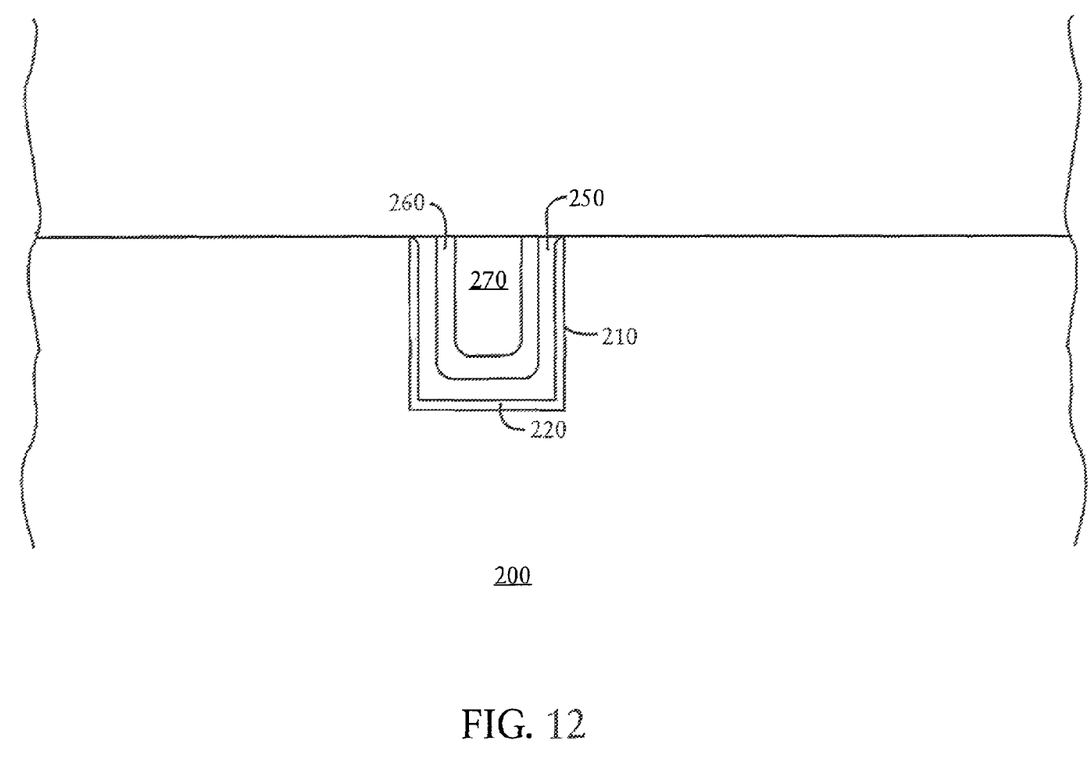

Another embodiment of the present invention related to STI is illustrated in FIGS. 10 through 12 wherein similar features bear similar references characters. Adverting to FIG. 10, a shallow trench 210 is formed in semiconductor substrate 200 and a thermal oxide liner 220 formed therein. Subsequently, a first dielectric layer 250 is deposited followed by post deposition curing to obtain uniform properties and ensure a uniformly high etch rate throughout the thickness of layer 250. Subsequently, second dielectric layer 260 is deposited followed by post deposition curing for homogenization.

A third dielectric layer 270, as shown in FIG. 11, is then deposited followed by post deposition curing for homogeneity. Subsequently, as illustrated in FIG. 12, CMP is implemented to form the completed STI structure.

The present invention is applicable in various of stages of semiconductor fabrication wherein a dielectric layer is deposited within an opening or a gap. Embodiments of the present invention ensure that gap-filling is implemented without generating voids and to ensure that uniform properties are obtained throughout the entire thickness of the dielectric layer, particularly a uniform high etch rate.

The present invention provides methodology enabling the fabrication of semiconductor devices, particularly flash memory devices, such as mirrorbit devices, exhibiting improved reliability with homogeneous gap-filling. Semiconductor memory devices produced in accordance with the present invention enjoy industrial applicability in various commercial electronic devices, such as computers, mobile phones, cellular handsets, smartphones, set-top boxes, DVD players and recorders, automotive navigation, printers and peripherals, networking and telecom equipment, gaming systems, and digital cameras.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of fabricating a semiconductor device, the method comprising:
   depositing a first layer of dielectric material into a layer feature comprising an opening of a layer or a gap between elements;
   depositing a second layer of dielectric material on the first deposited layer of dielectric material and into the layer feature; and
   separately curing the first and second layers after each layer is deposited;
   wherein the first dielectric layer comprises boron and phosphorous-doped tetraethyl orthosilicate (BPTEOS), and the second dielectric layer comprises BPTEOS; and
   wherein the first dielectric layer contains a greater amount of boron than the second dielectric layer, and the second dielectric layer contains a greater amount of phosphorous than the first dielectric layer.

2. The method of claim 1, comprising:
   depositing at least one additional layer of dielectric material into the layer feature; and
   separately curing each additional layer of dielectric material after deposition.

3. The method of claim 1, further comprising:
   depositing each layer of dielectric material at a thickness of about 10 Å; and separately curing each layer of dielectric material by either heating at a temperature of about 400° C. to about 1000° C., or exposing the layer to ultraviolet (UV) radiation.

4. The method of claim 1, wherein the layer feature is a shallow trench in a semiconductor substrate, the method comprising filling the trench with the layers of dielectric material, with intermediate post deposition curing, to form a shallow trench isolation (STI) structure.

5. The method of claim 1, comprising depositing the layers of dielectric material into a gap between two spaced apart gate electrode structures.

6. The method of claim 1, wherein:
   the first layer of dielectric material comprises boron-doped silicon oxide derived from tetraethyl orthosilicate (BTEOS); and the second dielectric layer comprises phosphorous-doped tetraethyl orthosilicate (PTEOS).

7. The method according to claim 1, wherein the first and second dielectric layers comprise the same dielectric material.

8. The method according to claim 1, wherein the first and second dielectric layers comprise different dielectric materials.

9. The method of claim 2, comprising:
   depositing three to six layers of dielectric material; and
   separately curing each layer of dielectric material after deposition.

10. The method of claim 2, comprising:
    depositing each layer of dielectric material at a thickness of about 10 Å to about 500 Å; and
    separately curing each layer of dielectric material after deposition by either heating at a temperature of about 400° C. to about 1000° C., or exposing the layer to ultraviolet (UV) radiation.

11. The method of claim 2, wherein the layer feature is a shallow trench in a semiconductor substrate, the method comprising filling the trench with the layers of dielectric material, with intermediate post deposition curing, to form a shallow trench isolation (STI) structure.

12. The method according to claim 4, wherein each dielectric layer comprises the same dielectric material.

13. The method of claim 5, wherein each gate electrode structure comprises a dielectric sidewall spacer on side surfaces thereof.

14. The method of claim 5, wherein each gate electrode structure comprises:
    a gate dielectric stack comprising a first oxide layer, a nitride layer on the first oxide layer, and a second oxide layer on the nitride layer; and
    a gate electrode on the gate dielectric stack.

* * * * *